United States Patent [19]

Hiyamizu et al.

[11] Patent Number: 4,799,088
[45] Date of Patent: Jan. 17, 1989

[54] HIGH ELECTRON MOBILITY SINGLE HETEROJUNCTION SEMICONDUCTOR DEVICES AND METHODS FOR PRODUCTION THEREOF

[75] Inventors: Satoshi Hiyamizu, Tokoyo; Toshio Fujii, Kanagawa, both of Japan

[73] Assignee: Fujitsu Limited, Kawasaki, Japan

[21] Appl. No.: 286,863

[22] Filed: Jul. 27, 1981

[30] Foreign Application Priority Data

Jul. 28, 1980 [JP] Japan .................. 55-103422

[51] Int. Cl.$^4$ .................. H01G 29/161
[52] U.S. Cl. .................. 357/16; 351/22; 351/58; 351/15; 351/88
[58] Field of Search ............. 357/16, 225 P, 58, 15 P, 357/15 PGA, 15 R, 88, 4; 29/576 E

[56] References Cited

U.S. PATENT DOCUMENTS 4,155,784 5/1979 Mills et al. .................. 357/61 X
4,194,935 3/1980 Dingle et al. .................. 357/16 X
4,346,394 8/1982 Figueroa .................. 357/16

FOREIGN PATENT DOCUMENTS 54-12261 6/1977 Japan .

OTHER PUBLICATIONS

Delagebeaudent et al., "Two-Dimensional Electron Gas MESFET Structure" *Electronic Lett.*, vol. 16, No. 17, pp. 667-668, Aug. 1980.
Dingle et al., "Electron Mobilities in Modulation-doped semiconductor Hetrojunction Superlettres", *Appl. Phys. Lett.*, vol. 33, No. 7, pp. 665-667, Oct. 1978.
Mimura et al., "A New Field-Effect Transistor with Selectively Doped GaAsln-AlGaAs Heterojunctions" *Jap. Jour. Appl. Phys.*, vol. 19 No. 5 pp. 225-227, May 1980.
Hiyamizu et al., "High Mobility of Two-Dimensional Electrons at the GaAs/AlGAs Hetrojunction Interlace," *Appl. Phys. Lett.* vol. 37, No. 9 pp. 805-807, Nov. 1980.

*Primary Examiner*—Martin H. Edlow
*Attorney, Agent, or Firm*—Staas & Halsey

[57] ABSTRACT

A high electron mobility single heterojunction semiconductor devices having a layer configuration comprising a N-type AlGaAs layer grown on an undoped GaAs layer grown on an undoped AlGaAs layer grown on a semiconductor substrate containing an impurity producing a deep level. The undoped AlGaAs layer has at least three functions including (a) a getter for the deep level impurity which may be diffused from the substrate during an annealing process, (b) a buffer improving the crystal condition of the undoped GaAs layer, and (c) a test layer grown for the purpose of predetermining the intensity of molecular or ion beams for each of Al, Ga, As and dopants e.g. Si. This allows annealing processes and ion implantation processes to be introduced to the method for production of this type of semiconductor devices without reducing the electron mobility thereof.

10 Claims, 3 Drawing Sheets

HIGH ELECTRON MOBILITY SINGLE HETEROJUNCTION SEMICONDUCTOR DEVICES AND METHODS FOR PRODUCTION THEREOF

BACKGROUND OF THE INVENTION

This invention relates to semiconductor devices with high electron mobility utilizing electrons accumulated in the neighborhood of a single heterojunction due to the difference in electron affinity between two different kinds of semiconductors which interleave a single heterojunction therebetween and methods for production thereof. More specifically, this invention relates to an improvement applicable to high electron mobility transistors (hereinafter referred to as "HEMT") which are Field Effect Transistors (FET'S) provided with an undoped or unintentionally doped GaAs layer and an N-type AlGaAs layer interleaving a single functional heterojunction therebetween and allowing electrons with high mobility to be accumulated in the undoped or unintentionally doped GaAs layer in the form of quasi-two-dimensional electron gas appearing contiguous with the single functional heterojunction due to the difference in electron affinity between GaAs and AlGaAs. Thereby, the accumulated electrons in the form of quasi-two-dimensional electron gas and having high mobility, function as the sole carriers or conductive channel of the FET's. Further, this invention relates to an improvement applicable to the methods for production of HEMT's described above.

A HEMT is an active semiconductor device of which the conductive channel consists of electrons accumulated in a quadratic surface contiguous with a single heterojunction interleaved between a layer of a semiconductor having a lower electron affinity (e.g. AlGaAs) and another layer of a semiconductor having a larger electron affinity (e.g. GaAs).

One example of HEMT's is an FET having a layer configuration comprising an N-type AlGaAs layer grown on an undoped GaAs layer further grown on a Cr-doped GaAs substrate having a high resistance. Also comprising the HEMT is a Schottky barrier type gate electrode, and a pair of source and drain electrodes ohmically contacted with a conductive channel formed by a two-dimensional electron gas accumulated in the undoped GaAs layer in the form of a plane contiguous with a single heterojunction interleaved between the N-type AlGaAs layer and an undoped GaAs layer. The outstanding feature of HEMT's is the extremely high electron mobility availble in the conductive channel or the two-dimensional electron gas at cryogenic temperatures, e.g. 4° K. through 77° K. The thickness of this conductive channel or two-dimensional electron gas is extremely small specifically less than 100 Å. Furthermore, two-dimensional electron gas is accumulated in the undoped GaAs layer in the form of a plane contiguous with the single heterojunction of the N-type AlGaAs layer and an undoped GaAs layer, and has a geometrical position separate from the N-type AlGaAs layer which supplies electrons to the two-dimensional electron gas. Therefore, the mobility of electrons comprising the two-dimensional electron gas is free from the effects of ionized-impurity scattering. On the other hand, it is well-known that ionized-impurity scattering is the major factor preventing the electron mobility from increasing at cryogenic temperatures. As described earlier, since ionized-impurity scattering has no effect on the magnitude of electron mobility of the electrons in the two-dimensional electron gas, the electron mobility therein becomes extremely large at cryogenic temperatures at which ionized-impurity scattering is inherently the major factor preventing electron mobility from increasing. The results of experiments show that the magnitude of this improvement in electron mobility is more than 10.

Since the N-type AlGaAs layer supplies electrons to the two-dimensional electron gas, the N-type AlGaAs layer is depleted to some extent. Therefore, when the thickness and impurity concentration, the magnitude of the Schottky barrier of the gate and the difference in electron affinity between a semiconductor which supplies electrons to the two-dimensional electron gas (N-type AlGaAs in this case) and the other semiconductor in which the two-dimensional electron gas is accumulated (undoped GaAs in this case) are each the proper magnitude, it is possible to entirely deplete the N-type AlGaAs layer. This is because the depletion layer caused by the Schottky barrier gate and the depletion layer caused by the movement of electrons into the two-dimensional electron gas due to the difference in electron affinity between AlGaAs and GaAs in contact with each other under thermal equilibrium. Since the undoped GaAs is non-conductive, the quadratic electron gas functions as the sole channel for the layer configuration described above. Further, when a voltage is applied to the gate electron, the electron concentration of the two-dimensional electron gas can be readily modulated, thereby the FET having the layer configuration described above can have a large magnitude of transfer conductance Gm.

The inventors of this invention have discovered that the magnitude of electron mobility in the two-dimensional electron gas is sizably decreased by heat treatment or annealing applied thereto. They assumed this undesirable decrease in electron mobility is caused by the effect of ionized-impurity scattering of impurities, for example Si, diffused to the semiconductor layer in which the two-dimensional electron gas is accumulated, undoped GaAs in this case, from the semiconductor layer which supplies electrons to the two-dimensional electron gas, N-type AlGaAs in this case, during the heat treatment or annealing process. A known method effective to prevent unexpected diffusion of impurities from occurring during the growing of semiconductor layers is to interleave an undoped semiconductor layer between two layers having a different impurity concentrations. However, it would be impossible to absolutely prevent impurities from diffusing into the undoped GaAs layer from the N-type AlGaAs layer.

In addition, the results of experiments carried out by the inventors of this invention show that not only an N-type impurity such as Si which is assumed to have diffused from the N-type AlGaAs layer but also an impurity which produces a deep level, such as Cr, is contained in the undoped GaAs layer. Since this impurity uniformly spreads throughout the entire 1-μm thickness of the undoped GaAs layer, it would be impossible to prevent this type of impurity diffusion from occurring, unless some other layer configuration is employed.

Further, it is widely recognized that it is not easy to grow a ternary or quaternary semiconductor layer. It is also widely recognized that the molecular beam epitaxy process or the ion beam epitaxy process is most appropriate for the growth of such layers, because it allows production of an abrupt heterojunction, and accurate control of thickness and of doping concentration. However, it is not necessarily easy to accurately control the composition of such a compound semiconductor. Unfortunately, however, control of the composition of AlGaAs and GaAs layers is extremely important in the production of HEMT's, because these compositions are included in the parameters determining the quality of HEMT's.

OBJECTS AND SUMMARY OF THE INVENTION

An object of this invention is to provide a HEMT having a layer configuration with an N-type AlGaAs layer grown on an undoped GaAs layer interleaving a heterojunction therebetween, to allow electrons to be accumulated contiguous with the heterojunction in the undoped GaAs layer, the HEMT having a high magnitude of electron mobility even after being subjected to an annealing process.

Another object of this invention is to provide a method for production of a HEMT having the same layer configuration as described above, the method improving the control of the composition of the ternary and/or quaternary compound semiconductors, particularly the composition of the N-type AlGaAs layer.

An additional object of this invention is to provide a method for production of a HEMT having the same layer configuration as described above, the method allowing employment of ion implantation process.

To accomplish the above presented first object, a HEMT in accordance with this invention is provided with an undoped AlGaAs layer interleaved between an undoped GaAs layer on which an N-type AlGaAs layer is grown to supply electrons to a two-dimensional electron gas which is accumulated contiguous with the heterojunction of the above described two layers to function as the conductive channel of this HEMT, and a semi-insulating GaAs substrate, for example a Cr-doped GaAs substrate. This newly introduced undoped AlGaAs layer has three functions including: (a) a getter for the deep level impurity, such as Cr, which may be diffused from the Cr-doped GaAs substrate during one or more annealing processes employed later; (b) a buffer connecting the semi-insulating substrate and the undoped GaAs layer in which the two-dimensional electron gas is accumulated; and (c) a type of a test layer grown for predetermining the intensity of each ingredient's molecular beam or ion beam for the ultimate purpose of controlling the composition of the N-type AlGaAs layer which is to be grown layer in the same continuous process for production of the HEMT.

To accomplish the above presented second and third objects, a method for production of a HEMT in accordance with this invention comprises a step to grow an undoped AlGaAs layer on a semi-insulating GaAs substrate or a Cr-doped GaAs substrate, a step to grow an undoped GaAs layer on the undoped AlGaAs layer, a step to grow an N-type AlGaAs layer having the same composition as the above described undoped AlGaAs layer, before one or more gate electrodes and a pair of source and drain electrodes are produced on the above described layer configuration. The step to grow the undoped AlGaAs layer has two functions including: (a) a function to improve the crystal conditions of the undoped GaAs layer to be grown on the undoped AlGaAs layer (buffer effect); and (b) a function to provide a test layer grown for predetermining the intensity of each ingredient's molecular beam or ion beam namely, the quantity of Al, Ga, As and some dopants, employed for the ultimate purpose of accurately controlling the composition of the N-type AlGaAs layer. Incidentally, since the introduction of the undoped AlGaAs layer interleaved between the semi-insulating GaAs substrate and the doped GaAs layer is effective to prevent an impurity with a deep level, such as Cr, from diffusing during an annealing process to be applied later, this allows employment of ion implantation process for various purposes, including adjustment of doping level of any semiconductor layer.

BRIEF DESCRIPTION OF THE DRAWINGS

The invention, together with its features and advantages, can be readily understood from the following more detailed description presented in conjunction with the following drawings, in which.

DETAILED DESCRIPTION OF PREFERRED EMBODIMENTS

In the following description, an MBE system or IBE system provided with equipment for measurement of the intensity of a molecular beam or of an ion beam and measurement of the internal gas pressure of the vacuum chamber, is employed for production of a semiconductor layer configuration. Exemplary models of such equipment are a quadruple mass spectrometer (hereinafter referred to as a QMS) and a nude ion gauge.

Figure 1:
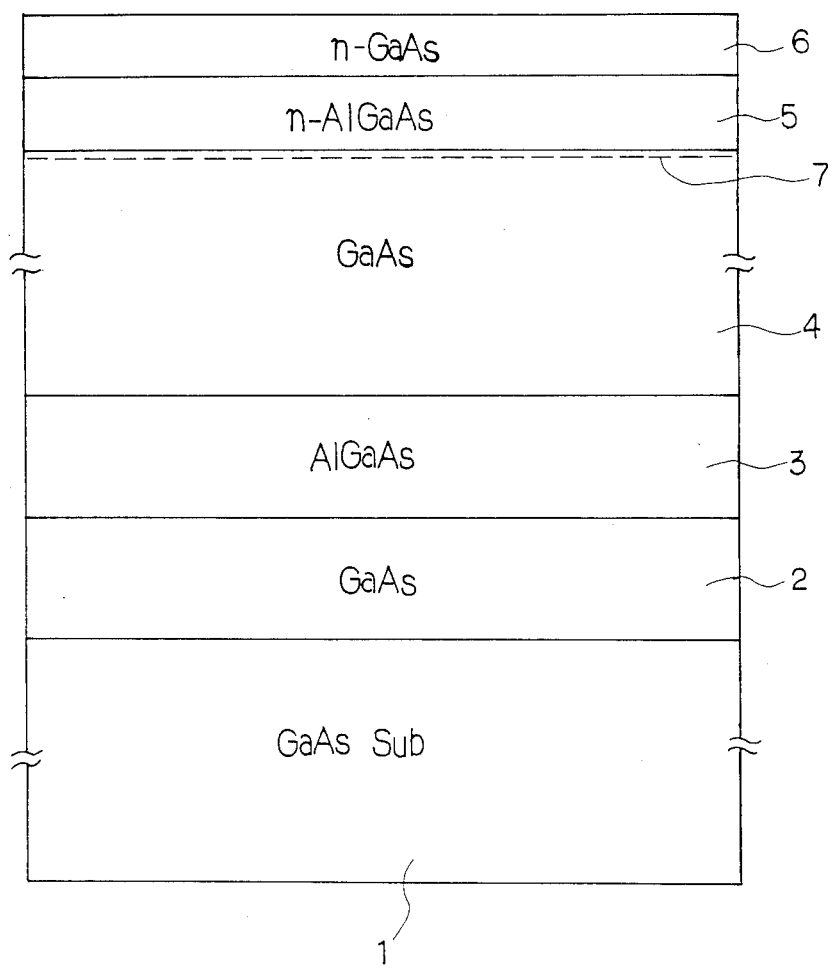
FIG. 1 is a schematic sectional view of a wafer for forming a HEMT in accordance with an embodiment of this invention.

Referring to FIG. 1, grown on a Cr-doped GaAs substrate 1 is an undoped GaAs layer 2 having a thickness of 1,000 Å which functions as a buffer. During the period in which this undoped GaAs layer 2 is grown, the internal pressure of the vacuum chamber is accurately controlled. In addition, a QMS and a nude ion gauge are employed to control the intensity of the Ga molecular or ion beam and that of the As molecular or ion beam, respectively at their optimum levels.

An undoped AlGaAs layer 3 having the ratio of Al vs. Ga as 3 vs. 7 and having a thickness of 1,000 Å is grown on the undoped GaAs layer 2. This undoped AlGaAs layer 3 is the layer newly introduced by this invention. Though the layer 3 forms a heterojunction with the GaAs layer 2, any electron accumulation layer is not formed along this heterojunction because the undoped layer 3 does not supply electrons. During the period in which this undoped AlGaAs layer 3 is grown, a QMS is employed to control the intensity of the Al molecular or ion beam and that of the Ga molecular or ion beam to realize an optimum ratio of Al and Ga in the product AlGaAs, under the accurate control of the internal pressure of the vacuum vessel.

Thereafter, an undoped GaAs layer 4 having a thickness of 6,000 Å in which the two-dimensional electron gas is accumulated, is grown on the undoped AlGaAs layer 3. During the period in which this undoped GaAs layer 4 is grown, a shutter is closed for the Al source, while keeping the temperature of the Al source or the intensity of the Al molecular or ion beam unchanged. Further, the intensity of Ga and As molecular or ion beams is kept unchanged. In other words, it is not necessary to change the intensity of any of the Al, Ga and As molecular or ion beams. The only action necessary to shift to this step from the previous step is closure of the shutter of the Al source. This is because it is possible to grow a binary compound semiconductor without accurate control of the intensity of each ingredient molecular or ion beam.

An N-type AlGaAs layer 5 having a thickness of 600 Å is grown, this layer supplying electrons to the two-dimensional electron gas 7 formed in the undoped GaAs layer 4 contiguous with the heterojunction between the N-type AlGaAs layer 5 and the undoped GaAs layer 4. The ratio of Al vs. Ga is 3 vs. 7, as was in the case of the undoped AlGaAs layer 3. However, the doped AlGaAs layer is doped with Si to a concentration of $2 \times 10^{18}/cm^3$. The only action necessary to shift to this step from the previous step is to open the shutters of the Al source and the Si source, because the optimum condition for the desired intensity of each ingredients molecular or ion beam has been maintained during the previous step. As a result, the composition of the N-type AlGaAs layer 5 is accurately controlled as expected from the beginning of its formation, thereby realizing a satisfactory quality of the heterojunction between the undoped GaAs layer 4 and the N-type AlGaAs layer 5. This is extremely important to realize high electron mobility in the two-dimensional electron gas 7. Although it is not shown in FIG. 1, it is preferable to leave a 50 to 60-Å portion of the N-type AlGaAs layer 5 contiguous with the heterojunction undoped, because it is effective to prevent Si from diffusing into the undoped GaAs layer 4 from the N-type AlGaAs layer 5.

An N-type GaAs layer 6 having a thickness of 500 Å is then grown. Since this layer is doped with Si to a concentration of about $2 \times 10^{18}/cm^3$, it is effective to produce ohmic contact with AuGe source and drain electrodes (described below).

Discussed below are the reasons and theoretical basis for the growing of ternary or quaternary semiconductor layers having a precise composition, and particularly the maintaining of one or more good quality heterojunctions therebetween. Out of the parameters available in the MBE or IBE processes, the intensity of each ingredients molecular or ion beam or the temperature of each source is most important for the precise control of composition of such compound semiconductors. Since the required intensity of each molecular or ion beam varies, the rate of depletion of each source varies. Therefore, it is not easy to keep the sensitivity and/or accuracy of control of each molecular or ion beam uniformly at a desired level. It is well-known that the internal pressure of a vacuum chamber, the temperature of a substrate and the ratio of the magnitudes of intensity of molecular or ion beam are the important parameters for growing a binary compound semiconductor. In the case of ternary or quaternary compound semiconductors, the control of the intensity of each molecular or ion beam is the most important parameter. Therefore, various means are implemented for MBE or IBE systems to satisfy the above requirement. Namely, (a) preparation of a Kunudsen cell with the optimum size, (b) arrangement of thermal sensors as many as possible at optimum positions to enable more precise control of the temperature of each source, and (c) employment of means to decrease the effects of unstable surface position of liquid sources. However, it is particularly difficult to produce a heterojunction with a good quality between such ternary or quaternary semiconductors or between such a ternary or quaternary semiconductor and some other type of semiconductor. This is because it is difficult to accurately control the intensity of each ingredient's molecular or ion beam, particularly at the beginning of a growth step. Accordingly, in the case where a heterojunction is produced between a simple substance or binary compound semiconductor layer and a ternary or quaternary semiconductor layer grown on the simple substance or binary compound semiconductor layer, growth of a test layer of a ternary or quaternary semiconductor identical to that of the upper layer of the heterojunction, prior to growing the lower layer of the simple substance or binary compound semiconductor layer is effective to adjust the composition of the ternary or quaternary semiconductor as required. The procedure is that: (a) during the growth step of the lowest layer of the ternary or quaternary semiconductor, the intensity of each ingredient's molecular or ion beam is accurately controlled by employment of a QMS and a nude ion gauge; (b) during the growth step of the lower layer, e.g., the binary compound semiconductor, supply of one or two sources is suspended, for example, by employment of one or more shutters, while the intensity of each ingredient's molecular or ion beam is maintained as adjusted in the first step; and (c) during the growth step of the upper layer of the ternary or quaternary semiconductor, the supply of the suspended sources is resumed. Since the intensity of each ingredient's molecular or ion beam was maintained during the second step, as it was adjusted in the first step, it is possible to produce a ternary or quaternary semiconductor having a composition as required from the beginning of its formation, thereby enabling production of a good quality heterojunction between the upper and lower layers. Since the intensity of the Al molecular or ion beam is difficult to maintain at a specific amount for a long time, this method is effective to produce ternary or quaternary semiconductors containing Al. Further, since the quality of the functional heterojunction between the N-type AlGaAs layer and the undoped GaAs layer has a decisive influence on the electron mobility of a HEMT, this method is effective to produce a better quality HEMT than conventional methods. In addition, the simplicity of this procedure is one advantage inherent to this method.

Figure 2:
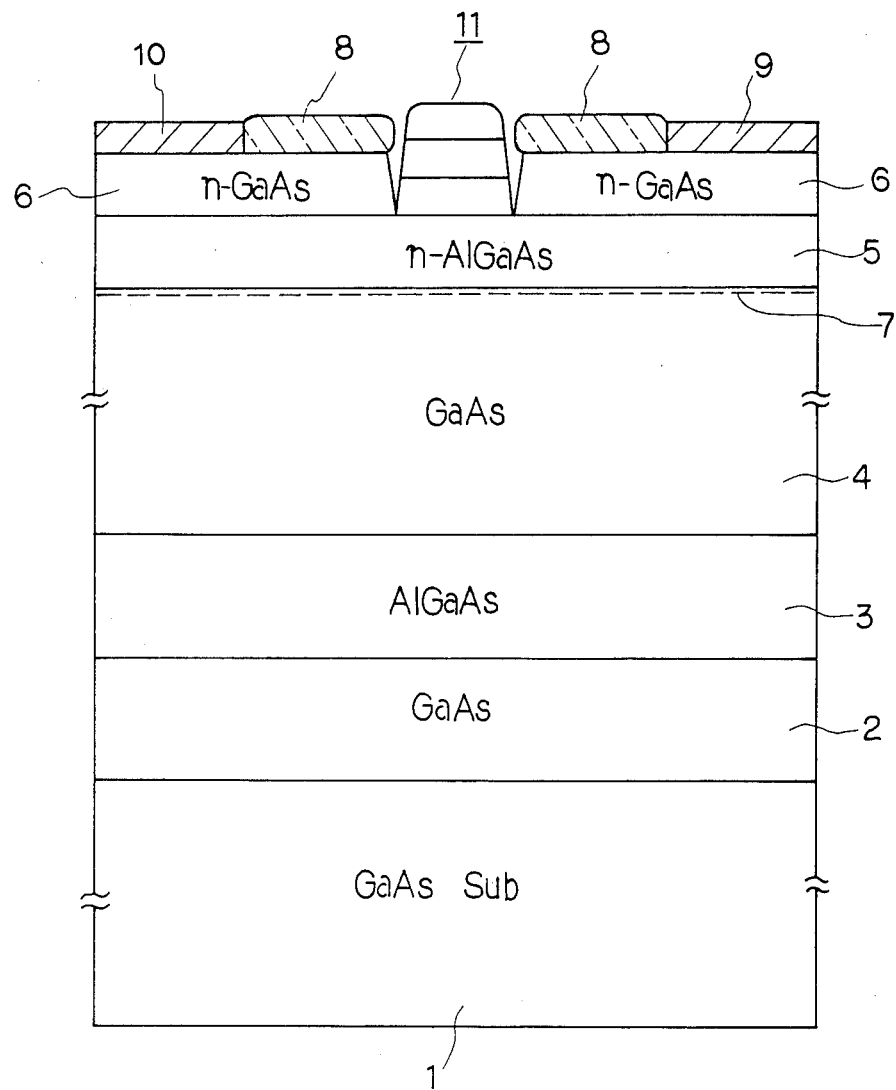
FIG. 2 is a schematic sectional view of an HEMT in accordance with an embodiment of this invention produced employing the wafer shown in FIG. 1.

Referring to FIG. 2, an $SiO_2$ film 8 is produced on the top surface of the N-type GaAs layer 6 employing a spattering process or the like. The $SiO_2$ film 8 is removed from the areas where a source electrode and a drain electrode are to be produced. An AuGe film is produced on the top surface of the wafer employing an evaporation process or the like. After the AuGe film is patterned to a shape of a source electrode 9 and a drain electrode 10, a heat treatment or annealing process is applied to the wafer for the purpose of ensuring ohmic contact between the source and drain electrodes 9 and 10 and the two-dimensional electron gas (or the conductive channel) 7 which is formed contiguous with the heterojunction, albeit the alloyed regions are not shown on the figure. An AuGe film can be substituted by a cumulative film of AuGe and Au. Thereafter, the $SiO_2$ film 8 and the N-type GaAs layer 6 are removed from the area where a gate electrode is to be produced. A cumulative film of Ti, Pt and Au is produced on the top surface of the wafer successively employing an evaporation process or the like. The Ti/Pt/Au film is patterned to a shape of a gate electrode 11. A photoresist film employed for etching of the SiO$_2$ film 8 and the N-type GaAs layer 6 may be employed also for patterning of the gate electrode 11. In other words, the Ti/Pt/Au film could be produced on the top surface of the wafer on which the photoresist remains, before the Ti/Pt/Au film and the photoresist film are concurrently removed.

Results of experiments show that the HEMT produced as described above has improved electron mobility in comparison with the HEMT's available in the prior art.

Presented below are the results of an experiment carried out to confirm the advantage expected for this invention. The criteria of the experiment are as follows. First a number of specimen wafers are produced. They are classified into two groups, one of which represents a HEMT in accordance with this invention and the other represents a HEMT available in the prior art. Each wafer of the first group has configuration similar to that shown in FIG. 2, namely, a 500-Å N-type GaAs layer with the impurity concentration of about $2\times 10^{18}$/cm$^3$ grown on a 540-Å N-type AlGaAs layer with almost the same impurity concentration as described above grown on a 60-Å undoped portion of the AlGaAs layer grown on a 4,000-Å undoped GaAs layer grown on a 1,000-Å undoped AlGaAs layer grown on a 1,000-Å undoped GaAs layer grown on a 1,000-Å undoped AlGaAs layer grown on a 1,000-Å undoped GaAs layer grown on a Cr-doped GaAs substrate Each wafer of the second group has a layer configuration having a 500-Å N-type GaAs layer with the impurity concentration of about $2\times 10^{18}$/cm$^3$ grown on a 540-Å N-type AlGaAs layer with almost the same amount of impurity concentration as described above grown on a 60-Å undoped AlGaAs layer grown on a 8,000-Å undoped GaAs layer grown on a Cr-doped GaAs substrate. Secondly, a 4,000–5,000-Å SiO$_2$ film is produced on the top surface of each specimen wafer produced as described above, employing a spattering process. Thirdly, each specimen wafer is heat treated or annealed in an H$_2$ atmosphere for 15 minutes at various temperatures ranging from 700° C. through 790° C. Fourthly, the electron mobility of the two-dimensional electron gas and the quadratic or sheet concentration of electrons (hereinafter referred to as "sheet electron concentration") accumulated contiguous with the heterojunction between the N-type AlGaAs layer and the undoped GaAs layer and due to the difference in electron affinity of the two different kinds of semiconductors described above, are measured for each specimen wafer at a cryogenic temperature, specifically 77° K.

Figure 3:
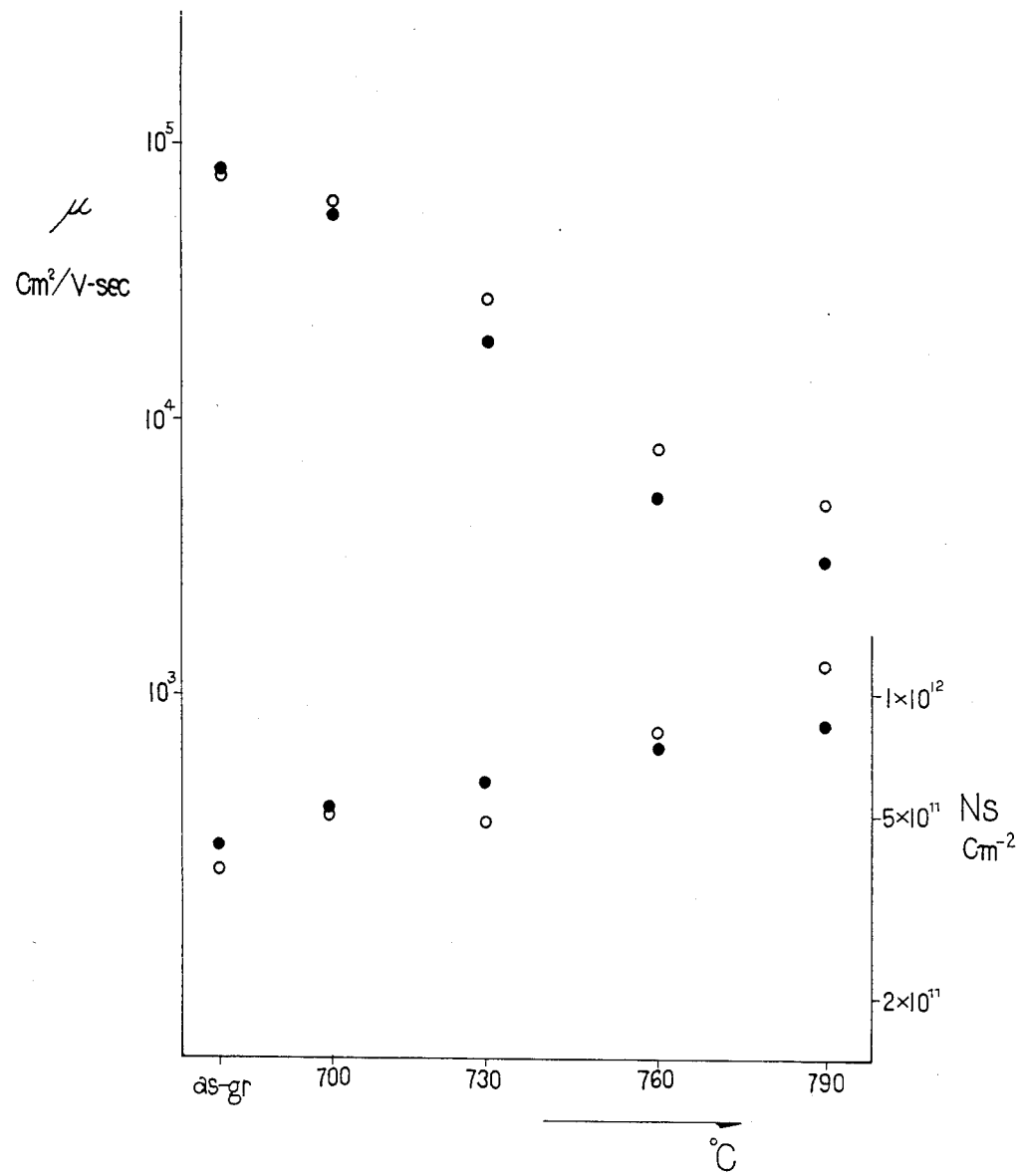
FIG. 3 is a graph comparing the magnitudes of electron mobility of wafers having a layer configuration of a HEMT in accordance with this invention and wafers having a layer configuration of a HEMT in the prior art.

FIG. 3 is a graph showing the results of the experiment described above. The X-axis shows the annealing temperature. The symbol "As-gr" standing for "as grown" means that no annealing process was applied thereto. The Y-axis shows the demonstrated electron mobility $\mu$ and the sheet electron concentration Ns. The open circles and the solid circles respectively show the results for the specimen representing a HEMT in accordance with this invention and the results for the specimen representing a HEMT available in the prior art. Referring to FIG. 3, a tendency is observed that a higher annealing temperature is accompanied by a larger amount of sheet electron concentration Ns and a less amount of electron mobility $\mu$. This implies that the silicon diffuses from the N-type AlGaAs layer into the undoped GaAs layer. Further observed is that although no distinct difference is observed for the amount of electron mobility of the both specimens at As-gr, an increasingly larger difference is observed for a specimen annealed at an increaasingly higher temperature. For example, the specimen representing a HEMT in accordance with this invention has the electron mobilities of 62,000 cm$^2$/V-sec and 27,000 cm$^2$/V-sec, respectively, when annealed at temperatures of 700° C. and 730° C., while the corresponding mobilities for the specimens representing a HEMT available in the prior art decrease to 54,000 cm$^2$/V-sec and 19,000 cm$^2$/V-sec, respectively. This clearly demonstrates that the HEMT in accordance with this invention has a larger amount of electron mobility than the HEMT available in the prior art, even after a heat treatment or annealing process in applied thereto, because an impurity having a deep level, such as Cr, is effectively prevented from diffusing into the undoped GaAs layer from the Cr-doped GaAs substrate due to the existence of an undoped AlGaAs layer.

The above described experimental results show that annealing processes can be introduced into the method for production of HEMT's, resulting in the possibility of employing ion implantation for the purposes of controlling the pinch-off voltage or threshold voltage of a HEMT, and the production of ohmic contact for source and drain electrodes and the like. Although an ion implantation process inevitably requires an annealing process, ion implanting is extremely helpful in producing IC's containing HEMT's. In other words, if an ion implantation process is employed in production of a HEMT having a layer configuration consisting of a N-type AlGaAs layer and an undoped GaAs layer, then an annealing process in the temperature range of 700° C. or higher is required. If an annealing process of this temperature range is applied to a wafer for production of a HEMT having the layer configuration available in the prior art, the amount of electron mobility of the two-dimensional electron gas is considerably decreased, resultantly devastating the features inherent to a HEMT. However, in the case of a wafer for producing a HEMT in accordance with this invention, an annealing process at such a temperature range as described above has a less adverse effect on the amount of electron mobility of the two-dimensional electron gas, thus safely maintaining the features and advantages inherent to a HEMT.

Although the embodiments have been described for HEMT's having an undoped GaAs layer in which the two-dimensional electron gas accumulates to form a sole conductive channel for the HEMT's, a N-type GaAs layer is acceptable for this purpose, insofar as the ratio of the impurity concentration thereof and that of the N-type AlGaAs layer is larger than 10$^2$. Therefore, this invention is applicable also to these cases.

It has become clear that in accordance with this invention, a HEMT is provided having a layer configuration which allows heat treatment or annealing processes to be applied thereto without being accompanied by diffusion of impurities producing a deep level, such as Cr, into a layer of semiconductor having a larger amount of electron affinity and which resultantly maintains a high amount of electron mobility after such heat treatment or annealing processes. It is further clear that such a layer configuration provides a method for production of a HEMT, the method having improved control of the composition of the ternary and/or quaternary compound semiconductors specifically of N-type AlGaAs. In addition, such a layer configuration which allows annealing processes, additionally allows ion implantation processes to be introduced into a method for production of a HEMT.

Although the invention has been described with reference to specific embodiments, this description is not meant to be construed in a limiting sense. Various modifications of the disclosed embodiments, as well as other embodiments of this invention, will become apparent to persons skilled in the art upon reference to the description of this invention. It is therefore contemplated that the appended claims will cover any such modifications or embodiments as fall within the true scope of this invention.

What is claimed is:

1. A high electron mobility heterojunction semiconductor device comprising:
    a semi-insulating GaAs substrate;
    an undoped AlGaAs layer grown on the semi-insulating GaAs substrate;
    a GaAs layer grown on said undoped AlGaAs layer, said GaAs layer having a low N-type impurity concentration;
    a N-type AlGaAs layer grown on said GaAs layer, and defining a heterojunction between said GaAs layer and said N-type AlGaAs layer;
    at least one gate electrode formed on said N-type AlGaAS layer; and
    a pair of source and drain electrodes arranged flanking said at least one gate electrode.

2. A high electron mobility heterojunction semiconductor device comprising:
    a semi-insulating semiconductor substrate comprising a first semiconductor material and being doped with a first impurity;
    a buffer layer formed on said semi-insulating semiconductor substrate and comprising said first semiconductor material;
    a first undoped layer formed on said buffer layer and comprising a second semiconductor material;
    a binary semiconductor layer formed on said first undoped layer and comprising the first semiconductor material;
    a ternary semiconductor layer formed on said binary semiconductor layer, comprising said second semiconductor material, being doped with a second impurity and defining a heterojunction between said binary semiconductor layer and said ternary semiconductor layer;
    a gate electrode formed on said ternary semiconductor layer; and
    a pair of source and drain electrodes formed on said ternary semiconductor layer and flanking said gate electrode.

3. A high electron mobility heterojunction semiconductor device according to claim 2, wherein said ternary semiconductor layer is doped with said second impurity to a specified distance above said heterojunction.

4. A high electron mobility heterojunction semiconductor device according to claim 3, wherein said specified distance is in the range of 50 Å to 60 Å.

5. A high electron mobility heterojunction semiconductor device according to claim 2, wherein said ternary semiconductor layer is doped with said second impurity to a concentration of approximately $2 \times 10^{18}/cm^3$.

6. A high electron mobility heterojunction semiconductor device according to claim 5, wherein said second impurity is silicon.

7. A high electron mobility heterojunction semiconductor device according to claim 2, wherein said first semiconductor material comprises GaAs and said second semiconductor material comprises AlGaAs.

8. A high electron mobility heterojunction semiconductor device according to claim 7, wherein the ratio of Al to Ga in said AlGaAs is approximately 3 to 7.

9. A high electron mobility heterojunction semiconductor device according to claim 2, wherein said first impurity comprises Cr.

10. A high electron mobility heterojunction semiconductor device according to claim 2, wherein said binary semiconductor layer is doped with an N-type impurity.

* * * * *